United States Patent [19]

Higashibeppu et al.

[11] Patent Number: 5,648,012
[45] Date of Patent: Jul. 15, 1997

[54] PIEZOELECTRIC CERAMIC COMPOSITION

[75] Inventors: Makoto Higashibeppu; Tomohiro Kawamoto; Tomonori Eguchi; Kenichi Yoshimura; Katsuhiko Onitsuka; Harumi Hayashi, all of Kokubu, Japan

[73] Assignee: Kyocera Corporation, Kyoto, Japan

[21] Appl. No.: 577,204

[22] Filed: Dec. 21, 1995

[30] Foreign Application Priority Data

Dec. 22, 1994 [JP] Japan ................. 6-320154
Oct. 31, 1995 [JP] Japan ................. 7-283828
Nov. 30, 1995 [JP] Japan ................. 7-312539

[51] Int. Cl.$^6$ ............................. C04B 35/49
[52] U.S. Cl. ................. 252/62.9 PZ; 252/62.9 R; 501/134; 501/135; 501/136
[58] Field of Search ............. 252/62.9 R, 62.9 PZ; 501/134, 135, 136

[56] References Cited

FOREIGN PATENT DOCUMENTS 1646675  3/1972  Germany .............. 252/62.9 PZ
2653406  5/1977  Germany .............. 252/62.9 PZ
48-12718 4/1973  Japan ................. 252/62.9 PZ
49-45115 12/1974 Japan ................. 252/62.9 PZ

*Primary Examiner*—Anthony Green
*Attorney, Agent, or Firm*—Loeb & Loeb LLP

[57] ABSTRACT

A piezoelectric ceramic composition comprising a perovskite compound which contains, as metal components, Pb, Sr, Zr, Ti, Nb, Cr, Y, Co and at least one element selected from La, Gd, Nd, Sm and Pr, and may further contain Sb or Na, wherein when the composition formula is expressed as, $$(Pb_{1-x-\alpha-y}Sr_xNa_\alpha M_y)_a[(Nb_bY_cCr_dCo_eSb_\beta)_fTi_gZr_{1-f-g}]O_3,$$

wherein M is at least one element selected from La, Gd, Nd, Sm and Pr, then, x, y, a, b, c, d, e, f, g, $\alpha$ and $\beta$ satisfy the following relationships, $0.005 \leq x \leq 0.08$, $0.002 \leq y \leq 0.05$, $0.95 \leq a \leq 1.05$, $0.47 \leq b \leq 0.70$, $0.02 \leq c \leq 0.31$, $0.11 \leq d \leq 0.42$, $0.01 \leq e \leq 0.12$, $0.02 \leq f \leq 0.15$, $0.46 \leq g \leq 0.52$, $0 \leq \alpha \leq 0.005$, $0 \leq \beta \leq 0.13$, and $b+c+d+e+\beta=1.00$. The piezoelectric ceramic composition of the present invention exhibits a high electromechanical coupling coefficient Kp, a low mechanical quality factor Qm, a low dielectric constant $\epsilon r$, excellent heat resistance, and can be preferably used as a piezoelectric part for being mounted on the surface and, particularly, as a digital piezoelectric.

8 Claims, No Drawings

PIEZOELECTRIC CERAMIC COMPOSITION

BACKGROUND OF THE INVENTION

1. Field of the Invention

The present invention relates to a piezoelectric ceramic composition. More specifically, the invention relates to a piezoelectric ceramic composition that can be used as ceramic filters, ceramic resonators, ultrasonic oscillators, piezoelectric buzzers, piezoelectric ignition units, ultrasonic motors, piezoelectric fans, piezoelectric actuators, and as piezoelectric sensors such as acceleration sensors, knocking sensors and AE sensors. Particularly, the invention relates to a piezoelectric ceramic composition that can be preferably used as a second intermediate-frequency filter in a mobile communication unit such as analog cellular telephone, digital cellular telephone, etc.

2. Description of the Prior Art

Products utilizing a piezoelectric ceramic composition can be represented by ceramic filters, ceramic resonators, ultrasonic oscillators, piezoelectric buzzers, piezoelectric ignition units, ultrasonic motors, piezoelectric fans, piezoelectric sensors, piezoelectric actuators and the like.

Here, as the elements of ceramic filters and ceramic resonators, there has been used a ceramic composition comprising chiefly $PbZrO_3$—$PbTiO_3$ which is blended with, or substituted with, a metal oxide such as $Nb_2O_5$ or $MnO_2$, or with a composite perovskite oxide such as $Pb(Nb_{2/3}Mg_{1/3})O_3$ or $Pb(Nb_{2/3}Co_{1/3})O_3$.

There has heretofore been known a composition $Pb(Nb_{2/3}Co_{1/3})O_3$—$PbZrO_3$—$PbTiO_3$ as a piezoelectric ceramic composition having a large planar electromechanical coupling coefficient Kp and excellent piezoelectric property.

In recent years, furthermore, it has been urged to provide piezoelectric parts such as ceramic filters and ceramic resonators that can be used under various conditions such as being mounted on the surface of a substrate. Such piezoelectric parts are subject to be heated at from about 230° C. to about 300° C. when they are mounted on the substrate by reflow soldering. Therefore, these piezoelectric devices must have resistance against the heat.

In a filter designed to work on a band of, for example, several kilohertz by utilizing the planar vibration of a piezoelectric ceramics, furthermore, it becomes necessary to use a material having a small dielectric constant er and excellent heat resistance in order to increase the planar electromechanical coupling coefficient Kp, to decrease the mechanical quality factor, Qm and to increase the level at the defined frequencies. In a digital cellular telephone, in particular, it is required to stabilize the group delay time characteristics of a filter within a guarantee band in order to prevent the infiltration of noise from the neighboring channels.

However, the above-mentioned $Pb(Nb_{2/3}Co_{1/3})O_3$—$PbZrO_3$—$PbTiO_3$ ceramic composition has a small resistance against the heat and causes the piezoelectric characteristics and resonant frequency to change to a large extent before and after the reflow soldering, which are problems from the practical point of view. Besides, this composition exhibits piezoelectric characteristics and resonant frequency that change to a great extent after the thermal shock test. When this composition is used for a filter in a communication unit mounted on a vehicle which will be subjected to severe environmental changes, it becomes difficult to maintain stable transmission and reception due to changes in the characteristics of the device.

Because of its dielectric constant er which is as large as about 1800, furthermore, the device must be provided with a partial electrode. Moreover, the large mechanical quality factor Qm deteriorates the group delay time characteristics.

SUMMARY OF THE INVENTION

The object of the present invention is to provide a piezoelectric ceramic composition having a large planar electromechanical coupling coefficient Kp, a small mechanical quality factor Qm, a small dielectric constant er and excellent heat resistance.

The present inventors have discovered the fact that a piezoelectric ceramic composition having a large planar electromechanical coupling coefficient Kp, a small mechanical quality factor Qm, a small dielectric constant er and excellent resistance against the heat and against the thermal shock can be obtained by using a composite perovskite compound having a predetermined composition containing Pb, Sr, Zr, Ti, Nb, Y, Cr, Co and at least one element selected from La, Gd, Nd, Sm and Pr, or by using the composite perovskite compound which further contains Na or Sb in an amount within a predetermined range, and have arrived at the present invention.

According to the present invention, there is provided a piezoelectric ceramic composition comprising a perovskite compound which contains, as metal components, Pb, Sr, Zr, Ti, Nb, Cr, Y, Co and at least one element selected from La, Gd, Nd, Sm and Pr, and may further contain Sb or Na, wherein when the composition formula is expressed as,

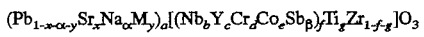

wherein M is at least one element selected from La, Gd, Nd, Sm and Pr, x, y, a, b, c, d, e, f, g, $\alpha$ and $\beta$ satisfy the following relationships, $0.005 \leq x \leq 0.08$
$0.002 \leq y \leq 0.05$
$0.95 \leq a \leq 1.05$
$0.47 \leq b \leq 0.70$
$0.02 \leq c \leq 0.31$
$0.11 \leq d \leq 0.42$
$0.01 \leq e \leq 0.12$
$0.02 \leq f \leq 0.15$
$0.46 \leq g \leq 0.52$
$0 \leq \alpha \leq 0.005$
$0 \leq \beta \leq 0.13$
$b+c+d+e+\beta=1.00$.

The piezoelectric ceramic composition of the present invention exhibits a high planar electromechanical coupling coefficient Kp, a low mechanical quality factor Qm, a low dielectric constant er and improved resistance against the heat and thermal shock as a result of partly substituting Zr and Ti in the $PbZrO_3$—$PbTiO_3$ ceramic composition with Nb, Cr, Y and Co and, further, depending upon the cases, with Sb, and partly substituting Pb with Sr and at least one element selected from La, Gd, Nd, Sm and Pr and, further, depending upon the cases, with Na.

DETAILED DESCRIPTION OF THE PREFERRED EMBODIMENTS

When the composition formula of the piezoelectric ceramic composition of the present invention is expressed as

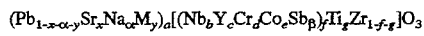

wherein M is at least one element selected from La, Gd, Nd, Sm and Pr, and when $(Pb_{1-x-\alpha-y}Sr_xNa_\alpha M_y)_a$ in the above formula is defined to be the site A and $[(Nb_bY_cCr_dCo_eSb_\beta)_f Ti_gZr_{1-f-g}]$ is defined to be the site B, the composition ratio a of the site A in the ceramic composition of the present invention must be within a range of $0.95 \leq a \leq 1.05$. When the ratio a is smaller than 0.95 or is larger than 1.05, the composition loses the planar electromechanical coupling coefficient Kp and the heat resistance.

It is further necessary that the amount x of substitution of Sr in the site A is within a range of $0.005 \leq x \leq 0.08$. When the amount x is smaller than 0.005, the planar electromechanical coupling coefficient Kp becomes small and when the amount x is larger than 0.08, the dielectric constant εr becomes large, which are not desirable.

It is necessary that the amount y of substitution of M, i.e., at least one metal component selected from La, Gd, Nd, Sm and Pr is within a range of $0.002 \leq y \leq 0.05$. When the amount y is smaller than 0.002, the planar electromechanical coupling coefficient Kp becomes small and when the amount is larger than 0.05, the dielectric constant εr increases and the heat resistance decreases.

As the metal component M, it is desired to use La from the standpoint of accomplishing a high planar electromechanical coupling coefficient Kp, a low dielectric constant, and high heat resistance.

In the site A in the ceramic composition of the present invention, furthermore, Pb may be partly substituted with Na at a ratio α of up to 0.005. In this case, it is allowed to further improve the heat resistance and to further decrease the dielectric constant.

In the present invention, it is necessary that the amount f of substitution of $(Nb_bY_cCr_dCo_eSb_\beta)_f$ in $[(Nb_bY_cCr_dCo_eSb_\beta)_fTi_gZr_{1-f-g}]$ which is the site B is within a range of $0.02 \leq f \leq 0.15$. When the amount f is smaller than 0.02, the planar electromagnetic coupling coefficient Kp decreases and when the amount f is larger than 0.15, the dielectric constant εr increases and the heat resistance decreases drastically.

In the site B, furthermore, it is necessary that the amount g of substitution of Ti with Zr is within a range of $0.46 \leq g \leq 0.52$. When the amount g is smaller than 0.46, the dielectric constant εr increases and the heat resistance decreases, and when the amount g is larger than 0.52, the planar electromechanical coupling coefficient Kp becomes too small.

In the site B, it is necessary that the amount b of Nb is within a range of $0.47 \leq b \leq 0.70$. When the amount b is smaller than 0.47, the mechanical quality factor Qm becomes large and when the amount b is larger than 0.70, the dielectric constant εr increases and the heat resistance decreases.

It is necessary that the amount c of Y is within a range of $0.02 \leq c \leq 0.31$. When the amount c is smaller than 0.02, the mechanical quality factor Qm greatly increases and when the amount c is larger than 0.31, the dielectric constant εr increases and the heat resistance decreases.

It is necessary that the amount d of Cr is within a range of $0.11 \leq d \leq 0.42$. When the amount d is smaller than 0.11, the heat resistance decreases and when the amount d is larger than 0.42, the mechanical quality factor Qm increases and the group delay time characteristics are deteriorated and, depending upon the cases, the dielectric constant increases and the heat resistance decreases.

It is necessary that the amount e of Co is within a range of $0.01 \leq e \leq 0.12$. When the amount e is smaller than 0.01, the dielectric constant εr increases. When the amount e is larger than 0.12, the mechanical quality factor Qm becomes too great.

In the site B of the ceramic composition of the present invention, $(Nb_bY_cCr_dCo_e)$ may further contain Sb. In this case, its amount is not larger than 0.13. This makes it possible to further decrease the mechanical quality factor Qm. When the amount of Sb exceeds 0.13, however, the heat resistance decreases, which is not desirable.

According to a preferred embodiment of the present invention, the piezoelectric ceramic composition comprises a perovskite compound which contains, as metal components, Pb, Sr, Zr, Ti, Nb, Cr, Y, Co and at least one element selected from La, Gd, Nd, Sm and Pr, wherein when the composition formula is expressed as,

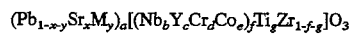

wherein M is at least one element selected from La, Gd, Nd, Sm and Pr, x, y, a, b, c, d, e, f and g satisfy the following relationships, $0.01 \leq x \leq 0.08$
$0.002 \leq y \leq 0.05$
$0.95 \leq a \leq 1.05$
$0.52 \leq b \leq 0.62$
$0.02 \leq c \leq 0.31$
$0.11 \leq d \leq 0.42$
$0.02 \leq e \leq 0.12$
$0.02 \leq f \leq 0.15$
$0.46 \leq g \leq 0.52$
$b+c+d+e=1.00$.

In the case of the piezoelectric ceramic composition of this embodiment, it is desired that the amount x of Sr in the site A is within a range of $0.01 \leq x \leq 0.08$ from the standpoint of improving the planar electromechanical coupling coefficient Kp. It is further desired that the amount b of Nb in the site B is within a range of $0.52 \leq b \leq 0.62$ from the same point of view.

It is further desired that the amount e of Co is within a range of $0.02 \leq e \leq 0.12$ from the standpoint of improving the dielectric constant εr. In the ceramic composition of this embodiment, in particular, it is desired that x, y, a, b, c, d, e, f and g lie within the following ranges, $0.01 \leq x \leq 0.015$
$0.003 \leq y \leq 0.005$
$0.99 \leq a \leq 1.01$
$0.56 \leq b \leq 0.61$
$0.02 \leq c \leq 0.17$
$0.22 \leq d \leq 0.26$
$0.02 \leq e \leq 0.09$
$0.05 \leq f \leq 0.07$
$0.48 \leq g \leq 0.51$.

Moreover, it is particularly desired that the metal component M is La.

According to another preferred embodiment of the present invention, the piezoelectric ceramic composition comprises a perovskite compound which contains, as metal components, Pb, Sr, Nb, Y, Cr, Co, Sb, Ti, Zr and at least one element selected from La, Gd, Nd, Sm and Pr, wherein when the composition formula is expressed as,

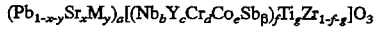

wherein M is at least one element selected from La, Gd, Nd, Sm and Pr, x, y, a, b, c, d, e, f, g and β satisfy the following relationships,
$0.005 \leq x \leq 0.08$
$0.002 \leq y \leq 0.05$
$0.95 \leq a \leq 1.05$
$0.47 \leq b \leq 0.58$
$0.02 \leq c \leq 0.31$ $0.11 \leq d \leq 0.42$
$0.01 \leq e \leq 0.12$
$0.02 \leq f \leq 0.15$
$0.46 \leq g \leq 0.52$
$0.01 \leq \beta \leq 0.13$
$b+c+d+e+\beta=1.00$.

In the case of the piezoelectric ceramic composition of the second embodiment, it is desired that the amount b of Nb in the site B is within a range of $0.47 \leq b \leq 0.58$ from the standpoint of the value Qm, value εr and heat resistance.

The composition of this embodiment has a feature in that Sb is present as a metal component in the site B. It is desired that the amount β of Sb lies within a range of $0.01 \leq \beta \leq 0.13$. When the amount β of Sb is smaller than 0.01, the value Qm is not much improved and when the amount β of Sb is larger than 0.13, the heat resistance slightly decreases.

In the composition of this embodiment, it is particularly desired that x, y, a, b, c, d, e, f, g and β lie within ranges satisfying the following relationships,
$0.01 \leq x \leq 0.03$
$0.003 \leq y \leq 0.02$
$0.99 \leq a \leq 1.01$
$0.49 \leq b \leq 0.54$
$0.09 \leq c \leq 0.17$
$0.20 \leq d \leq 0.26$
$0.02 \leq e \leq 0.09$
$0.05 \leq f \leq 0.07$
$0.48 \leq g \leq 0.51$.
$0.04 \leq \beta \leq 0.10$ It is further particularly desired that the metal component M is La.

According to a third preferred embodiment of the present invention, the piezoelectric ceramic composition comprises a perovskite compound which contains, as metal components, Pb, Sr, Na, Zr, Ti, Nb, Y, Cr, Co and at least one element selected from La, Gd, Nd, Sm and Pr, wherein when the composition formula is expressed as, $(Pb_{1-x-\alpha-y}Sr_xNa_\alpha M_y)[(Nb_bY_cCr_dCo_e)_fTi_gZr_{1-f-g}]O_3$ wherein M is at least one element selected from La, Gd, Nd, Sm and Pr,
x, y, a, b, c, d, e, f, g and α satisfy the following relationships,
$0.005 \leq x \leq 0.08$
$0.002 \leq y \leq 0.05$
$0.95 \leq a \leq 1.05$
$0.47 \leq b \leq 0.70$
$0.02 \leq c \leq 0.31$
$0.11 \leq d \leq 0.42$
$0.01 \leq e \leq 0.12$
$0.02 \leq f \leq 0.15$
$0.46 \leq g \leq 0.52$
$0.001 \leq \alpha \leq 0.005$
$b+c+d+e=1.00$.

The piezoelectric ceramic composition of the third embodiment has a feature in that Pb in the site A is partly substituted with Na. In the composition of this embodiment, it is desired that the amount α of substitution of Na is within a range of $0.001 \leq \alpha \leq 0.005$.

When the amount α is smaller than 0.001, the dielectric constant εr is not improved so much and when the amount α is larger than 0.005, the mechanical quality factor Qm increases and the heat resistance decreases.

In the composition of this embodiment, it is desired that the amount b of Nb in the site B lies within range of $0.47 \leq b \leq 0.70$.

In the composition of this embodiment, it is particularly desired that x, y, a, b, c, d, e, f, g and α lie within ranges satisfying the following relationships,
$0.01 \leq x \leq 0.03$
$0.003 \leq y \leq 0.02$
$0.99 \leq a \leq 1.01$
$0.49 \leq b \leq 0.65$
$0.09 \leq c \leq 0.17$
$0.20 \leq d \leq 0.26$
$0.02 \leq e \leq 0.09$
$0.05 \leq f \leq 0.07$
$0.48 \leq g \leq 0.51$
$0.001 \leq \alpha \leq 0.004$.

It is further particularly desired that the metal component M is La.

The piezoelectric ceramic composition of the present invention is obtained in a manner as described below. That is, starting powders of PbO, $ZrO_2$, $TiO_2$, $Nb_2O_5$, $Cr_2O_3$, $Y_2O_3$, $Co_3O_4$ and oxides or carbonates of Sr as well as an oxide of at least one element selected from La, Gd, Nd, Sm and Pr and, depending upon the cases, $Sb_2O_3$ or an oxide or a carbonate of Na, are weighed in predetermined amounts, and are wet-mixed together using a ball mill or the like for 10 to 24 hours. The mixture is then dehydrated, dried and is calcined at 800° to 1100° C. for 1 to 3 hours, and is pulverized again using the ball mill or the like.

The pulverized product is blended with an organic binder, granulated and is molded under the application of a predetermined pressure to prepare a molded article. The molded article is then fired in the open air at 1200° to 1350° C. for 0.5 to 4 hours.

In the thus obtained piezoelectric ceramic composition is precipitated a tetragonal perovskite crystal phase. There may be further precipitated other rhombohedral perovskite crystal phases.

EXAMPLES

The invention will now be described by way of the following Examples.

Example 1

Starting powders of PbO, $ZrO_2$, $TiO_2$, $Nb_2O_5$, $Cr_2O_3$, $Y_2O_3$, $Co_3O_4$, SrO as well as a starting powder of at least one oxide of La, Gd, Nd, Sm or Pr were weighed in predetermined amounts so as to obtain compositions as shown in Tables 1 and 2, and were wet-mixed for not shorter than 12 hours using a ball mill. The mixtures were then dehydrated, dried, calcined at 950° C. for 3 hours, and the calcined products were pulverized again using the ball mill.

TABLE 1

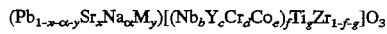

| Sample No. | x | y | a | b | c | d | e | f | g | 1-f-g |
|---|---|---|---|---|---|---|---|---|---|---|
| 1-*1 | 0 | 0.005 | 1.00 | 0.595 | 0.104 | 0.231 | 0.070 | 0.06 | 0.49 | 0.45 |
| 1-2 | 0.010 | 0.005 | 1.00 | 0.595 | 0.104 | 0.231 | 0.070 | 0.06 | 0.49 | 0.45 |

TABLE 1-continued $(Pb_{1-x-y}Sr_xM_y)a[(Nb_bY_cCr_dCo_e)_fTi_gZr_{1-f-g}]O_3$

| Sample No. | x | y | a | b | c | d | e | f | g | 1-f-g |
|---|---|---|---|---|---|---|---|---|---|---|
| 1-3 | 0.010 | 0.050 | 1.00 | 0.595 | 0.104 | 0.231 | 0.070 | 0.06 | 0.49 | 0.45 |
| 1-4 | 0.015 | 0.010 | 1.00 | 0.595 | 0.104 | 0.231 | 0.070 | 0.06 | 0.49 | 0.45 |
| 1-5 | 0.015 | 0.005 | 1.00 | 0.595 | 0.104 | 0.231 | 0.070 | 0.06 | 0.49 | 0.45 |
| 1-6 | 0.015 | 0.003 | 1.00 | 0.595 | 0.104 | 0.231 | 0.070 | 0.06 | 0.49 | 0.45 |
| 1-7 | 0.015 | 0.002 | 1.00 | 0.595 | 0.104 | 0.231 | 0.070 | 0.06 | 0.49 | 0.45 |
| 1-*8 | 0.015 | 0.001 | 1.00 | 0.595 | 0.104 | 0.231 | 0.070 | 0.06 | 0.49 | 0.45 |
| 1-*9 | 0.015 | 0.005 | 0.90 | 0.595 | 0.104 | 0.231 | 0.070 | 0.06 | 0.49 | 0.45 |
| 1-10 | 0.015 | 0.005 | 0.95 | 0.595 | 0.104 | 0.231 | 0.070 | 0.06 | 0.49 | 0.45 |
| 1-11 | 0.015 | 0.005 | 0.99 | 0.595 | 0.104 | 0.231 | 0.070 | 0.06 | 0.49 | 0.45 |
| 1-12 | 0.015 | 0.005 | 1.01 | 0.595 | 0.104 | 0.231 | 0.070 | 0.06 | 0.49 | 0.45 |
| 1-13 | 0.015 | 0.005 | 1.05 | 0.595 | 0.104 | 0.231 | 0.070 | 0.06 | 0.49 | 0.45 |
| 1-*14 | 0.015 | 0.005 | 1.10 | 0.595 | 0.104 | 0.231 | 0.070 | 0.06 | 0.49 | 0.45 |
| 1-*15 | 0.015 | 0.005 | 1.00 | 0.595 | 0.104 | 0.231 | 0.070 | 0.01 | 0.51 | 0.48 |
| 1-16 | 0.015 | 0.005 | 1.00 | 0.595 | 0.104 | 0.231 | 0.070 | 0.02 | 0.51 | 0.47 |
| 1-17 | 0.015 | 0.005 | 1.00 | 0.595 | 0.104 | 0.231 | 0.070 | 0.05 | 0.50 | 0.45 |
| 1-18 | 0.015 | 0.005 | 1.00 | 0.595 | 0.104 | 0.231 | 0.070 | 0.065 | 0.486 | 0.449 |
| 1-19 | 0.015 | 0.005 | 1.00 | 0.595 | 0.104 | 0.231 | 0.070 | 0.15 | 0.48 | 0.37 |
| 1-*20 | 0.015 | 0.005 | 1.00 | 0.595 | 0.104 | 0.231 | 0.070 | 0.06 | 0.45 | 0.49 |
| 1-21 | 0.015 | 0.005 | 1.00 | 0.595 | 0.104 | 0.231 | 0.070 | 0.06 | 0.46 | 0.48 |
| 1-22 | 0.015 | 0.005 | 1.00 | 0.595 | 0.104 | 0.231 | 0.070 | 0.06 | 0.48 | 0.46 |
| 1-23 | 0.015 | 0.005 | 1.00 | 0.595 | 0.104 | 0.231 | 0.070 | 0.06 | 0.51 | 0.43 |
| 1-24 | 0.015 | 0.005 | 1.00 | 0.595 | 0.104 | 0.231 | 0.070 | 0.06 | 0.52 | 0.42 |
| 1-25 | 0.080 | 0.005 | 1.00 | 0.595 | 0.104 | 0.231 | 0.070 | 0.06 | 0.49 | 0.45 |
| 1-*26 | 0.015 | 0.060 | 1.00 | 0.595 | 0.104 | 0.231 | 0.070 | 0.06 | 0.49 | 0.45 |
| 1-*27 | 0.015 | 0.005 | 1.00 | 0.595 | 0.104 | 0.231 | 0.070 | 0.20 | 0.48 | 0.32 |
| 1-28 | 0.015 | 0.005 | 1.00 | 0.520 | 0.130 | 0.260 | 0.090 | 0.06 | 0.49 | 0.45 |
| 1-29 | 0.015 | 0.005 | 1.00 | 0.540 | 0.120 | 0.260 | 0.080 | 0.06 | 0.49 | 0.45 |
| 1-30 | 0.015 | 0.005 | 1.00 | 0.560 | 0.110 | 0.250 | 0.080 | 0.06 | 0.49 | 0.45 |
| 1-31 | 0.015 | 0.005 | 1.00 | 0.580 | 0.110 | 0.240 | 0.070 | 0.06 | 0.49 | 0.45 |
| 1-32 | 0.015 | 0.005 | 1.00 | 0.600 | 0.100 | 0.230 | 0.070 | 0.06 | 0.49 | 0.45 |
| 1-33 | 0.015 | 0.005 | 1.00 | 0.610 | 0.100 | 0.220 | 0.070 | 0.06 | 0.49 | 0.45 |

Samples marked with * lie outside the scope of the invention.

TABLE 2

$(Pb_{1-x-y}Sr_xM_y)a[(Nb_bY_cCr_dCo_e)_fTi_gZr_{1-f-g}]O_3$

| Sample No. | x | y | a | b | c | d | e | f | g | 1-f-g |
|---|---|---|---|---|---|---|---|---|---|---|
| 1-34 | 0.015 | 0.005 | 1.00 | 0.620 | 0.100 | 0.220 | 0.060 | 0.06 | 0.49 | 0.45 |
| 1-*35 | 0.015 | 0.005 | 1.00 | 0.560 | 0.110 | 0.330 | 0 | 0.06 | 0.49 | 0.45 |
| 1-*36 | 0.015 | 0.005 | 1.00 | 0.560 | 0.320 | 0.110 | 0.010 | 0.06 | 0.49 | 0.45 |
| 1-37 | 0.015 | 0.005 | 1.00 | 0.560 | 0.090 | 0.330 | 0.020 | 0.06 | 0.49 | 0.45 |
| 1-38 | 0.015 | 0.005 | 1.00 | 0.580 | 0.170 | 0.230 | 0.020 | 0.06 | 0.49 | 0.45 |
| 1-39 | 0.015 | 0.005 | 1.00 | 0.560 | 0.310 | 0.110 | 0.020 | 0.06 | 0.49 | 0.45 |
| 1-40 | 0.015 | 0.005 | 1.00 | 0.560 | 0.050 | 0.370 | 0.020 | 0.06 | 0.49 | 0.45 |
| 1-41 | 0.015 | 0.005 | 1.00 | 0.540 | 0.020 | 0.420 | 0.020 | 0.06 | 0.49 | 0.45 |
| 1-*42 | 0.015 | 0.005 | 1.00 | 0.550 | 0.010 | 0.420 | 0.020 | 0.06 | 0.49 | 0.45 |
| 1-43 | 0.015 | 0.005 | 1.00 | 0.540 | 0.020 | 0.320 | 0.120 | 0.06 | 0.49 | 0.45 |
| 1-*44 | 0.015 | 0.005 | 1.00 | 0.630 | 0 | 0.230 | 0.140 | 0.06 | 0.49 | 0.48 |
| 1-45 | 0.015 | 0.004 | 1.00 | 0.610 | 0.100 | 0.220 | 0.070 | 0.05 | 0.49 | 0.46 |
| 1-46 | 0.015 | 0.003 | 1.00 | 0.580 | 0.110 | 0.240 | 0.070 | 0.07 | 0.48 | 0.45 |
| 1-47 | 0.015 | 0.002 | 1.10 | 0.600 | 0.100 | 0.230 | 0.070 | 0.07 | 0.48 | 0.45 |
| 1-*48 | 0.015 | 0.005 | 1.00 | 0.530 | 0.020 | 0.430 | 0.020 | 0.06 | 0.49 | 0.45 |
| 1-*49 | 0.015 | 0.005 | 1.00 | 0.540 | 0.020 | 0.310 | 0.130 | 0.06 | 0.49 | 0.45 |
| 1-50 | 0.015 | 0.004 | 1.00 | 0.610 | 0.100 | 0.220 | 0.070 | 0.05 | 0.49 | 0.46 |
| 1-51 | 0.015 | 0.004 | 1.00 | 0.610 | 0.100 | 0.220 | 0.070 | 0.05 | 0.49 | 0.46 |
| 1-52 | 0.015 | 0.004 | 1.00 | 0.610 | 0.100 | 0.220 | 0.070 | 0.05 | 0.49 | 0.46 |
| 1-53 | 0.015 | 0.004 | 1.00 | 0.610 | 0.100 | 0.220 | 0.070 | 0.05 | 0.49 | 0.46 |
| 1-54 | 0.015 | 0.004 | 1.00 | 0.580 | 0.110 | 0.230 | 0.080 | 0.05 | 0.49 | 0.46 |
| 1-55 | 0.015 | 0.004 | 1.00 | 0.560 | 0.020 | 0.300 | 0.120 | 0.05 | 0.49 | 0.46 |
| 1-56 | 0.015 | 0.004 | 1.00 | 0.610 | 0.100 | 0.220 | 0.070 | 0.10 | 0.49 | 0.41 |
| 1-57 | 0.015 | 0.004 | 1.00 | 0.610 | 0.100 | 0.220 | 0.070 | 0.15 | 0.49 | 0.36 |
| 1-*58 | 0.015 | 0.004 | 1.00 | 0.610 | 0.100 | 0.220 | 0.070 | 0.05 | 0.53 | 0.42 |
| 1-59 | 0.030 | 0.005 | 1.00 | 0.595 | 0.104 | 0.231 | 0.070 | 0.06 | 0.49 | 0.45 |

TABLE 2-continued $(Pb_{1-x-y}Sr_xM_y)a[(Nb_bY_cCr_dCo_e)_fTi_gZr_{1-f-g}]O_3$

| Sample No. | x | y | a | b | c | d | e | f | g | 1-f-g |
|---|---|---|---|---|---|---|---|---|---|---|
| 1-60 | 0.050 | 0.005 | 1.00 | 0.595 | 0.104 | 0.231 | 0.070 | 0.06 | 0.49 | 0.45 |
| 1-*61 | 0.100 | 0.005 | 1.00 | 0.595 | 0.104 | 0.231 | 0.070 | 0.06 | 0.49 | 0.45 |
| 1-62 | 0.015 | 0.020 | 1.00 | 0.595 | 0.104 | 0.231 | 0.070 | 0.06 | 0.49 | 0.45 |
| 1-63 | 0.015 | 0.040 | 1.00 | 0.595 | 0.104 | 0.231 | 0.070 | 0.06 | 0.49 | 0.45 |

*Samples marked with * lie outside the scope of the invention.

The pulverized products were then mixed with an organic binder (PVA) and were granulated. The obtained powders were press-molded into disks measuring 23 mm in diameter and 2 mm in thickness under a pressure of 1.5 to 2 tons/cm². The molded products were introduced into a hermetically sealed container made of MgO or the like and were fired in the open air at 1300° to 1350° C. for 2 hours.

The obtained sintered products were polished to form disks which were 0.5 mm thick. A silver paste was baked onto both surfaces of the disks at 600° C. to form electrodes. The disks were then polarized in a silicone oil maintained at 80° C. by applying a DC voltage of 3 kv/mm thereto for 30 minutes in order to evaluate their planar electromechanical coupling coefficients Kp, mechanical quality factor Qm and heat resistance. Their dielectric constants εr were also calculated from the capacitances found by using an impedance meter.

The planar electromechanical coupling coefficients Kp and the mechanical quality factor Qm were calculated from the resonant frequencies and anti-resonant frequencies measured by using an impedance meter (1 KHz, 1 Vrms). The heat resistance was evaluated in terms of a change $fr_a$ calculated in compliance with the equation $fr_a = |(fr2-fr1)|/fr1 \times 100$ based on a resonant frequency fr1 of before the testing in which the disks were passed through a solder reflow furnace of a peak temperature of 250° C. three times consecutively and a resonant frequency fr2 of after the testing. The results were as shown in Tables 3 and 4.

TABLE 3

| Sample No. | εr | Kp | Qm | $fr_a$ |
|---|---|---|---|---|
| 1-1* | 1180 | 38.2 | 148 | 0.01 |
| 1-2 | 1232 | 46.7 | 142 | -0.02 |
| 1-3 | 1374 | 55.7 | 132 | -0.03 |
| 1-4 | 1360 | 50.5 | 128 | 0.05 |
| 1-5 | 1268 | 48.7 | 134 | 0.01 |
| 1-6 | 1297 | 49.3 | 132 | -0.05 |
| 1-7 | 1070 | 45.4 | 158 | 0.02 |
| 1-*8 | 924 | 38.2 | 169 | 0.02 |
| 1-*9 | 1025 | 39.0 | 144 | -0.12 |
| 1-10 | 1058 | 47.2 | 148 | -0.10 |
| 1-11 | 1184 | 47.9 | 150 | -0.01 |
| 1-12 | 1265 | 49.3 | 144 | 0.04 |
| 1-13 | 1305 | 48.3 | 130 | 0.06 |
| 1-*14 | 1572 | 45.3 | 128 | 0.12 |
| 1-*15 | 982 | 37.5 | 135 | 0.02 |
| 1-16 | 1031 | 43.7 | 129 | 0.07 |
| 1-17 | 1144 | 46.8 | 137 | 0.02 |
| 1-18 | 1258 | 48.7 | 139 | 0.02 |
| 1-19 | 1430 | 49.2 | 135 | 0.08 |
| 1-*20 | 1825 | 54.9 | 108 | 0.15 |
| 1-21 | 1487 | 55.9 | 117 | -0.01 |
| 1-22 | 1348 | 52.5 | 128 | -0.03 |
| 1-23 | 1185 | 47.2 | 133 | -0.02 |
| 1-24 | 1062 | 40.0 | 148 | 0.03 |
| 1-25 | 1450 | 51.2 | 130 | -0.02 |
| 1-*26 | 1587 | 53.4 | 127 | -0.17 |
| 1-*27 | 1732 | 54.3 | 120 | -0.13 |
| 1-28 | 1202 | 45.7 | 182 | 0.03 |
| 1-29 | 1218 | 47.2 | 173 | -0.02 |
| 1-30 | 1239 | 48.8 | 150 | 0.01 |
| 1-31 | 1234 | 48.8 | 137 | 0.03 |
| 1-32 | 1402 | 51.7 | 133 | 0.02 |
| 1-33 | 1367 | 50.9 | 129 | 0.05 |

Samples marked with * lie outside the scope of the invention.

TABLE 4

| Sample No. | εr | Kp | Qm | $fr_a$ |
|---|---|---|---|---|
| 1-34 | 1456 | 52.3 | 126 | 0.04 |
| 1-*35 | 1599 | 51.6 | 93 | -0.04 |
| 1-*36 | 1530 | 49.1 | 108 | -0.22 |
| 1-37 | 1459 | 51.4 | 104 | 0.04 |
| 1-38 | 1422 | 51.8 | 119 | 0.09 |
| 1-39 | 1480 | 49.0 | 115 | 0.08 |
| 1-40 | 1467 | 48.5 | 165 | 0.01 |
| 1-41 | 1459 | 47.3 | 156 | 0.02 |
| 1-*42 | 1368 | 48.5 | 208 | 0.03 |
| 1-43 | 1267 | 46.7 | 185 | 0.02 |
| 1-*44 | 1159 | 44.8 | 209 | 0.04 |
| 1-45 | 1254 | 49.6 | 129 | 0.04 |
| 1-46 | 1285 | 49.2 | 146 | -0.01 |
| 1-47 | 1270 | 49.5 | 144 | 0 |
| 1-*48 | 1285 | 47.7 | 212 | 0.03 |
| 1-*49 | 1185 | 46.3 | 203 | 0.07 |
| 1-50 | 1273 | 48.6 | 130 | 0.01 |
| 1-51 | 1236 | 47.5 | 126 | 0.02 |
| 1-52 | 1325 | 49.3 | 121 | 0.04 |
| 1-53 | 1348 | 50.4 | 118 | 0.03 |
| 1-54 | 1272 | 50.2 | 141 | 0.03 |
| 1-55 | 1220 | 48.2 | 188 | 0.01 |
| 1-56 | 1433 | 51.2 | 134 | 0.06 |
| 1-57 | 1479 | 50.8 | 129 | 0.04 |
| 1-*58 | 1028 | 38.5 | 166 | 0.03 |
| 1-59 | 1250 | 42.3 | 138 | 0.03 |
| 1-60 | 1326 | 46.8 | 133 | 0.04 |
| 1-*61 | 1828 | 47.2 | 102 | -0.15 |
| 1-62 | 1428 | 50.6 | 142 | 0.03 |
| 1-63 | 1468 | 51.8 | 135 | 0.07 |

Samples marked with * lie outside the scope of the invention.

In Tables 1 and 2, the samples Nos. 1-1 to 1-49 and 1-54 to 1-63 have used La as M in the composition formula, the sample No. 1-50 has used Gd as M, the sample No. 1-51 has used Sm as M, the sample No. 1-52 has used Pr as M, and the sample No. 1-53 has used Nd as M.

From Tables 3 and 4, the piezoelectric ceramic compositions of Example 1 of the present invention exhibit planar electromechanical coupling coefficients Kp of as large as 40% or greater, mechanical quality factor Qm of as small as 200 or less, dielectric constants of as small as 1500 or less, and changes $fr_a$ of smaller than ±0.1% as measured by the heat resistance testing.

Example 2

Starting powders of at least one oxide of La, Gd, Nd, Sm or Pr and starting powders of PbO, $ZrO_2$, $TiO_2$, $Nb_2O_5$, $Cr_2O_3$, $Y_2O_3$, $Co_3O_4$, $Sb_2O_3$ and SrO were weighed in predetermined amounts such that the sintered products thereof will have compositions as shown in Tables 5 to 7, and were wet-mixed for not shorter than 12 hours using a ball mill that contained $ZrO_2$ balls. The mixtures were then dehydrated, dried, calcined at 950° C. for 3 hours, and the calcined products were pulverized again using the ball mill.

TABLE 5

$(Pb_{1-x-y}Sr_xM_y)_a[(Nb_bY_cCr_dCo_eSb_\beta)_fTi_gZr_{1-f-g}]O_3$

| Sample No. | x | y | a | b | c | d | e | β | f | g |
|---|---|---|---|---|---|---|---|---|---|---|
| 2-*1  | 0.000 | 0.004 | 1.000 | 0.510 | 0.170 | 0.230 | 0.020 | 0.070 | 0.050 | 0.490 |
| 2-2   | 0.005 | 0.004 | 1.000 | 0.510 | 0.170 | 0.230 | 0.020 | 0.070 | 0.050 | 0.490 |
| 2-3   | 0.008 | 0.004 | 1.000 | 0.510 | 0.166 | 0.215 | 0.020 | 0.080 | 0.050 | 0.490 |
| 2-4   | 0.010 | 0.004 | 1.000 | 0.510 | 0.170 | 0.230 | 0.020 | 0.070 | 0.050 | 0.490 |
| 2-5   | 0.015 | 0.003 | 1.000 | 0.511 | 0.170 | 0.226 | 0.023 | 0.070 | 0.050 | 0.485 |
| 2-6   | 0.030 | 0.004 | 1.000 | 0.510 | 0.170 | 0.230 | 0.020 | 0.070 | 0.050 | 0.490 |
| 2-7   | 0.050 | 0.004 | 1.000 | 0.510 | 0.170 | 0.230 | 0.020 | 0.070 | 0.050 | 0.490 |
| 2-8   | 0.070 | 0.004 | 1.000 | 0.510 | 0.170 | 0.230 | 0.020 | 0.070 | 0.050 | 0.490 |
| 2-9   | 0.080 | 0.004 | 1.000 | 0.510 | 0.170 | 0.230 | 0.020 | 0.070 | 0.050 | 0.490 |
| 2-*10 | 0.090 | 0.004 | 1.000 | 0.510 | 0.170 | 0.230 | 0.020 | 0.070 | 0.050 | 0.490 |
| 2-*11 | 0.010 | 0.001 | 1.000 | 0.510 | 0.170 | 0.230 | 0.020 | 0.070 | 0.050 | 0.490 |
| 2-12  | 0.015 | 0.002 | 1.000 | 0.511 | 0.170 | 0.226 | 0.023 | 0.070 | 0.050 | 0.490 |
| 2-13  | 0.015 | 0.003 | 1.000 | 0.518 | 0.084 | 0.242 | 0.076 | 0.080 | 0.050 | 0.490 |
| 2-14  | 0.015 | 0.004 | 1.000 | 0.511 | 0.170 | 0.226 | 0.023 | 0.070 | 0.050 | 0.490 |
| 2-15  | 0.015 | 0.005 | 1.000 | 0.510 | 0.205 | 0.205 | 0.020 | 0.060 | 0.050 | 0.490 |
| 2-*16 | 0.010 | 0.060 | 1.000 | 0.510 | 0.170 | 0.230 | 0.020 | 0.070 | 0.050 | 0.490 |
| 2-*17 | 0.010 | 0.004 | 0.930 | 0.510 | 0.170 | 0.230 | 0.020 | 0.070 | 0.050 | 0.490 |
| 2-18  | 0.010 | 0.004 | 0.950 | 0.510 | 0.170 | 0.230 | 0.020 | 0.070 | 0.050 | 0.490 |
| 2-19  | 0.015 | 0.003 | 0.980 | 0.511 | 0.170 | 0.226 | 0.023 | 0.070 | 0.050 | 0.490 |
| 2-20  | 0.015 | 0.003 | 0.990 | 0.510 | 0.170 | 0.230 | 0.020 | 0.070 | 0.050 | 0.490 |
| 2-21  | 0.015 | 0.003 | 1.010 | 0.510 | 0.170 | 0.230 | 0.020 | 0.070 | 0.050 | 0.490 |
| 2-22  | 0.015 | 0.003 | 1.020 | 0.511 | 0.170 | 0.226 | 0.023 | 0.070 | 0.050 | 0.490 |
| 2-23  | 0.015 | 0.003 | 1.050 | 0.511 | 0.170 | 0.226 | 0.023 | 0.070 | 0.050 | 0.490 |
| 2-*24 | 0.010 | 0.004 | 1.060 | 0.510 | 0.170 | 0.230 | 0.020 | 0.070 | 0.050 | 0.490 |
| 2-*25 | 0.010 | 0.004 | 1.000 | 0.449 | 0.154 | 0.209 | 0.118 | 0.070 | 0.050 | 0.490 |
| 2-26  | 0.010 | 0.004 | 1.000 | 0.470 | 0.170 | 0.226 | 0.023 | 0.111 | 0.050 | 0.490 |
| 2-27  | 0.010 | 0.004 | 1.000 | 0.490 | 0.178 | 0.241 | 0.021 | 0.070 | 0.050 | 0.490 |
| 2-28  | 0.015 | 0.003 | 1.000 | 0.510 | 0.170 | 0.230 | 0.020 | 0.070 | 0.050 | 0.505 |
| 2-29  | 0.010 | 0.003 | 1.000 | 0.523 | 0.136 | 0.226 | 0.045 | 0.070 | 0.050 | 0.490 |
| 2-30  | 0.015 | 0.003 | 1.000 | 0.529 | 0.170 | 0.231 | 0.020 | 0.050 | 0.050 | 0.495 |

Samples marked with * lie outside the scope of the invention.

TABLE 6

$(Pb_{1-x-y}Sr_xM_y)_a[(Nb_bY_cCr_dCo_eSb_\beta)_fTi_gZr_{1-f-g}]O_3$

| Sample No. | x | y | a | b | c | d | e | β | f | g |
|---|---|---|---|---|---|---|---|---|---|---|
| 2-31  | 0.015 | 0.004 | 1.000 | 0.547 | 0.095 | 0.204 | 0.084 | 0.070 | 0.050 | 0.490 |
| 2-32  | 0.015 | 0.004 | 1.000 | 0.580 | 0.095 | 0.234 | 0.051 | 0.040 | 0.050 | 0.490 |
| 2-*33 | 0.010 | 0.004 | 1.000 | 0.559 | 0.018 | 0.246 | 0.117 | 0.060 | 0.050 | 0.490 |
| 2-34  | 0.010 | 0.004 | 1.000 | 0.575 | 0.020 | 0.235 | 0.110 | 0.060 | 0.050 | 0.490 |
| 2-35  | 0.015 | 0.005 | 1.000 | 0.527 | 0.092 | 0.207 | 0.094 | 0.080 | 0.050 | 0.490 |
| 2-36  | 0.015 | 0.004 | 1.000 | 0.486 | 0.096 | 0.202 | 0.091 | 0.125 | 0.050 | 0.490 |
| 2-37  | 0.010 | 0.004 | 1.000 | 0.516 | 0.101 | 0.262 | 0.051 | 0.070 | 0.050 | 0.480 |
| 2-38  | 0.010 | 0.004 | 1.000 | 0.530 | 0.117 | 0.183 | 0.090 | 0.080 | 0.050 | 0.490 |
| 2-39  | 0.015 | 0.005 | 1.000 | 0.516 | 0.170 | 0.237 | 0.017 | 0.060 | 0.050 | 0.490 |
| 2-40  | 0.015 | 0.005 | 1.000 | 0.500 | 0.250 | 0.130 | 0.060 | 0.060 | 0.050 | 0.490 |
| 2-41  | 0.015 | 0.005 | 1.000 | 0.490 | 0.310 | 0.110 | 0.030 | 0.060 | 0.050 | 0.490 |
| 2-*42 | 0.010 | 0.005 | 1.000 | 0.481 | 0.322 | 0.115 | 0.022 | 0.060 | 0.050 | 0.485 |
| 2-*43 | 0.010 | 0.004 | 1.000 | 0.552 | 0.176 | 0.106 | 0.106 | 0.060 | 0.050 | 0.490 |
| 2-44  | 0.010 | 0.004 | 1.000 | 0.490 | 0.230 | 0.110 | 0.100 | 0.070 | 0.050 | 0.490 |
| 2-45  | 0.015 | 0.004 | 1.000 | 0.513 | 0.095 | 0.200 | 0.087 | 0.105 | 0.050 | 0.485 |
| 2-46  | 0.015 | 0.005 | 1.000 | 0.508 | 0.165 | 0.225 | 0.022 | 0.080 | 0.050 | 0.485 |
| 2-47  | 0.015 | 0.005 | 1.000 | 0.500 | 0.070 | 0.300 | 0.060 | 0.070 | 0.050 | 0.485 |
| 2-48  | 0.015 | 0.005 | 1.000 | 0.490 | 0.070 | 0.350 | 0.030 | 0.060 | 0.050 | 0.485 |
| 2-49  | 0.015 | 0.005 | 1.000 | 0.490 | 0.030 | 0.400 | 0.020 | 0.060 | 0.050 | 0.485 |
| 2-50  | 0.015 | 0.005 | 1.000 | 0.490 | 0.030 | 0.420 | 0.020 | 0.040 | 0.050 | 0.485 |
| 2-*51 | 0.015 | 0.005 | 1.000 | 0.480 | 0.020 | 0.440 | 0.020 | 0.040 | 0.050 | 0.485 |
| 2-*52 | 0.010 | 0.004 | 1.000 | 0.485 | 0.169 | 0.257 | 0.009 | 0.080 | 0.050 | 0.490 |

TABLE 6-continued $(Pb_{1-x-y}Sr_xM_y)_a[(Nb_bY_cCr_dCo_eSb_\beta)_fTi_gZr_{1-f-g}]O_3$

| Sample No. | x | y | a | b | c | d | e | β | f | g |
|---|---|---|---|---|---|---|---|---|---|---|
| 2-53 | 0.010 | 0.004 | 1.000 | 0.490 | 0.210 | 0.230 | 0.010 | 0.060 | 0.050 | 0.490 |
| 2-54 | 0.015 | 0.005 | 1.000 | 0.516 | 0.170 | 0.237 | 0.017 | 0.060 | 0.050 | 0.490 |
| 2-55 | 0.015 | 0.005 | 1.000 | 0.511 | 0.170 | 0.226 | 0.023 | 0.070 | 0.050 | 0.490 |
| 2-56 | 0.015 | 0.005 | 1.000 | 0.510 | 0.170 | 0.200 | 0.050 | 0.070 | 0.050 | 0.490 |
| 2-57 | 0.015 | 0.005 | 1.000 | 0.480 | 0.150 | 0.200 | 0.100 | 0.070 | 0.050 | 0.490 |
| 2-58 | 0.015 | 0.005 | 1.000 | 0.480 | 0.130 | 0.200 | 0.120 | 0.070 | 0.050 | 0.490 |
| 2-*59 | 0.010 | 0.005 | 1.000 | 0.549 | 0.100 | 0.164 | 0.127 | 0.060 | 0.050 | 0.490 |

Samples marked with * lie outside the scope of the invention.

TABLE 7

$(Pb_{1-x-y}Sr_xM_y)_a[(Nb_bY_cCr_dCo_eSb_\beta)_fTi_gZr_{1-f-g}]O_3$

| Sample No. | x | y | a | b | c | d | e | β | f | g |
|---|---|---|---|---|---|---|---|---|---|---|
| 2-60 | 0.015 | 0.005 | 1.000 | 0.540 | 0.170 | 0.226 | 0.054 | 0.010 | 0.050 | 0.490 |
| 2-61 | 0.015 | 0.005 | 1.000 | 0.511 | 0.170 | 0.226 | 0.023 | 0.070 | 0.050 | 0.490 |
| 2-62 | 0.015 | 0.005 | 1.000 | 0.500 | 0.170 | 0.210 | 0.020 | 0.100 | 0.050 | 0.490 |
| 2-63 | 0.015 | 0.005 | 1.000 | 0.480 | 0.170 | 0.200 | 0.020 | 0.130 | 0.050 | 0.490 |
| 2-*64 | 0.010 | 0.004 | 1.000 | 0.477 | 0.055 | 0.213 | 0.105 | 0.150 | 0.050 | 0.490 |
| 2-*65 | 0.010 | 0.004 | 1.000 | 0.510 | 0.170 | 0.230 | 0.020 | 0.070 | 0.010 | 0.490 |
| 2-66 | 0.015 | 0.003 | 1.000 | 0.511 | 0.170 | 0.226 | 0.023 | 0.070 | 0.020 | 0.490 |
| 2-67 | 0.015 | 0.003 | 1.000 | 0.511 | 0.170 | 0.226 | 0.023 | 0.070 | 0.040 | 0.490 |
| 2-68 | 0.015 | 0.005 | 1.000 | 0.511 | 0.170 | 0.226 | 0.023 | 0.070 | 0.050 | 0.490 |
| 2-69 | 0.015 | 0.003 | 1.000 | 0.511 | 0.170 | 0.226 | 0.023 | 0.070 | 0.080 | 0.490 |
| 2-70 | 0.015 | 0.003 | 1.000 | 0.511 | 0.170 | 0.226 | 0.023 | 0.070 | 0.100 | 0.490 |
| 2-71 | 0.015 | 0.003 | 1.000 | 0.511 | 0.170 | 0.226 | 0.023 | 0.070 | 0.150 | 0.490 |
| 2-*72 | 0.010 | 0.004 | 1.000 | 0.510 | 0.170 | 0.230 | 0.020 | 0.070 | 0.160 | 0.490 |
| 2-*73 | 0.010 | 0.004 | 1.000 | 0.510 | 0.170 | 0.230 | 0.020 | 0.070 | 0.050 | 0.450 |
| 2-74 | 0.015 | 0.003 | 1.000 | 0.511 | 0.170 | 0.226 | 0.023 | 0.070 | 0.080 | 0.460 |
| 2-75 | 0.015 | 0.005 | 1.000 | 0.511 | 0.170 | 0.226 | 0.023 | 0.070 | 0.050 | 0.490 |
| 2-76 | 0.015 | 0.003 | 1.000 | 0.511 | 0.170 | 0.226 | 0.023 | 0.070 | 0.080 | 0.515 |
| 2-77 | 0.015 | 0.005 | 1.000 | 0.511 | 0.170 | 0.226 | 0.023 | 0.070 | 0.080 | 0.520 |
| 2-*78 | 0.010 | 0.004 | 1.000 | 0.510 | 0.170 | 0.230 | 0.020 | 0.070 | 0.050 | 0.530 |
| 2-*79 | 0.010 | 0.004 | 1.000 | 0.486 | 0.020 | 0.423 | 0.021 | 0.050 | 0.050 | 0.490 |
| 2-80 | 0.015 | 0.005 | 1.000 | 0.510 | 0.200 | 0.230 | 0.020 | 0.040 | 0.050 | 0.490 |
| 2-81 | 0.015 | 0.005 | 1.000 | 0.511 | 0.170 | 0.226 | 0.023 | 0.070 | 0.050 | 0.490 |
| 2-82 | 0.015 | 0.005 | 1.000 | 0.511 | 0.170 | 0.226 | 0.023 | 0.070 | 0.050 | 0.490 |
| 2-83 | 0.015 | 0.005 | 1.000 | 0.511 | 0.170 | 0.226 | 0.023 | 0.070 | 0.050 | 0.490 |
| 2-84 | 0.015 | 0.010 | 1.000 | 0.510 | 0.200 | 0.230 | 0.020 | 0.040 | 0.050 | 0.490 |
| 2-85 | 0.015 | 0.020 | 1.000 | 0.511 | 0.170 | 0.226 | 0.023 | 0.070 | 0.050 | 0.490 |
| 2-86 | 0.015 | 0.040 | 1.000 | 0.511 | 0.170 | 0.226 | 0.023 | 0.070 | 0.050 | 0.490 |
| 2-87 | 0.015 | 0.050 | 1.000 | 0.511 | 0.170 | 0.226 | 0.023 | 0.070 | 0.050 | 0.490 |

Samples marked with * lie outside the scope of the invention.

The pulverized products were then mixed with an organic binder (PVA) and were granulated. The obtained powders were press-molded into disks measuring 23 mm in diameter and 2 mm in thickness under a pressure of 2 tons/cm². The molded products were introduced into a hermetically sealed container made of MgO or the like and were fired in the open air at 1300° C. for 2 hours.

The obtained sintered products were polished to form disks which were 0.5 mm thick. A silver paste was baked onto both surfaces of the disks at 600° C. to form electrodes. The disks were then polarized in a silicone oil maintained at 80° C. by applying a DC voltage of 3 kv/mm thereto for 30 minutes in order to evaluate their planar electromechanical coupling coefficients Kp, mechanical quality factor Qm and heat resistance. Their dielectric constants εr were also calculated from the capacitances found by using an impedance meter.

The electromechanical coupling coefficients Kp and the mechanical quality factor Qm were calculated from the resonant frequencies and anti-resonant frequencies measured by using an impedance meter (1 KHz, 1 Vrms). The heat resistance was evaluated in terms of a change $fr_a$ calculated in compliance with the equation $fr_a=|(fr2-fr1)|/fr1\times100$ based on a resonant frequency fr1 of before the testing in which the disks were passed through a solder reflow furnace of a peak temperature of 250° C. three times consecutively and a resonant frequency fr2 of after the testing. The results were as shown in Tables 8 to 10.

TABLE 8

| Sample No. | Kp (%) | Qm | εr | fra (%) |
|---|---|---|---|---|
| 2-*1 | 38.2 | 149 | 1083 | 0.07 |
| 2-2 | 43.3 | 135 | 1260 | 0.06 |
| 2-3 | 46.5 | 130 | 1295 | 0.06 |
| 2-4 | 48.5 | 127 | 1308 | 0.01 |
| 2-5 | 51.8 | 120 | 1400 | 0.02 |
| 2-6 | 51.0 | 122 | 1389 | 0.02 |
| 2-7 | 45.2 | 143 | 1458 | 0.05 |
| 2-8 | 45.0 | 144 | 1469 | 0.05 |

TABLE 8-continued

| Sample No. | Kp (%) | Qm | εr | fra (%) |
|---|---|---|---|---|
| 2-9 | 43.0 | 148 | 1483 | 0.07 |
| 2-*10 | 40.8 | 156 | 1773 | 0.08 |
| 2-*11 | 39.0 | 147 | 1109 | 0.06 |
| 2-12 | 46.0 | 138 | 1400 | 0.04 |
| 2-13 | 51.1 | 144 | 1353 | 0.03 |
| 2-14 | 49.0 | 124 | 1322 | 0.04 |
| 2-15 | 49.2 | 136 | 1426 | 0.03 |
| 2-*16 | 48.1 | 123 | 1433 | 0.12 |
| 2-*17 | 35.2 | 146 | 1067 | 0.15 |
| 2-18 | 43.2 | 145 | 1383 | 0.06 |
| 2-19 | 46.3 | 144 | 1406 | 0.05 |
| 2-20 | 52.1 | 126 | 1354 | 0.02 |
| 2-21 | 50.3 | 118 | 1389 | 0.02 |
| 2-22 | 43.6 | 153 | 1436 | 0.09 |
| 2-23 | 43.0 | 155 | 1482 | 0.09 |
| 2-*24 | 37.1 | 160 | 1541 | 0.22 |
| 2-*25 | 42.5 | 213 | 1453 | 0.08 |
| 2-26 | 42.0 | 160 | 1132 | 0.08 |
| 2-27 | 42.2 | 153 | 1146 | 0.06 |
| 2-28 | 46.7 | 128 | 1150 | 0.05 |
| 2-29 | 48.6 | 129 | 1218 | 0.01 |
| 2-30 | 51.3 | 145 | 1368 | 0.04 |

Samples marked with * lie outside the scope of the invention.

TABLE 9

| Sample No. | Kp (%) | Qm | εr | fra (%) |
|---|---|---|---|---|
| 2-31 | 42.7 | 115 | 1483 | 0.08 |
| 2-32 | 42.5 | 150 | 1498 | 0.08 |
| 2-*33 | 48.8 | 229 | 1563 | 0.06 |
| 2-34 | 48.0 | 150 | 1489 | 0.07 |
| 2-35 | 48.0 | 144 | 1403 | 0.05 |
| 2-36 | 46.0 | 125 | 1355 | 0.10 |
| 2-37 | 49.0 | 155 | 1406 | 0.02 |
| 2-38 | 46.2 | 140 | 1400 | 0.07 |
| 2-39 | 48.0 | 138 | 1496 | 0.02 |
| 2-40 | 47.0 | 140 | 1430 | 0.02 |
| 2-41 | 48.0 | 141 | 1435 | 0.02 |
| 2-*42 | 45.6 | 142 | 1753 | 0.17 |
| 2-*43 | 48.0 | 102 | 1450 | 0.17 |
| 2-44 | 48.3 | 140 | 1400 | 0.06 |
| 2-45 | 49.9 | 150 | 1243 | 0.04 |
| 2-46 | 50.0 | 121 | 1360 | 0.02 |
| 2-47 | 48.2 | 140 | 1370 | 0.02 |
| 2-48 | 47.5 | 140 | 1393 | 0.02 |
| 2-49 | 47.5 | 143 | 1400 | 0.01 |
| 2-50 | 46.3 | 160 | 1420 | 0.01 |
| 2-*51 | 43.8 | 220 | 1520 | 0.01 |
| 2-*52 | 42.3 | 182 | 1560 | 0.07 |
| 2-53 | 43.2 | 139 | 1497 | 0.05 |
| 2-54 | 48.0 | 138 | 1496 | 0.02 |
| 2-55 | 52.3 | 118 | 1420 | 0.04 |
| 2-56 | 50.1 | 123 | 1410 | 0.04 |
| 2-57 | 47.5 | 149 | 1406 | 0.05 |
| 2-58 | 45.2 | 173 | 1392 | 0.06 |
| 2-*59 | 41.3 | 225 | 1338 | 0.11 |

Samples marked with * lie outside the scope of the invention.

TABLE 10

| Sample No. | Kp (%) | Qm | εr | fra (%) |
|---|---|---|---|---|
| 2-60 | 45.8 | 160 | 1280 | 0.10 |
| 2-61 | 52.3 | 118 | 1420 | 0.04 |
| 2-62 | 47.2 | 122 | 1320 | 0.07 |
| 2-63 | 45.3 | 120 | 1270 | 0.10 |
| 2-*64 | 49.1 | 114 | 1130 | 0.21 |
| 2-*65 | 34.0 | 166 | 1075 | 0.20 |
| 2-66 | 45.2 | 147 | 1321 | 0.10 |
| 2-67 | 46.2 | 143 | 1396 | 0.06 |
| 2-68 | 48.5 | 110 | 1420 | 0.06 |
| 2-69 | 47.0 | 149 | 1449 | 0.05 |
| 2-70 | 47.2 | 148 | 1458 | 0.05 |
| 2-71 | 45.3 | 140 | 1482 | 0.06 |
| 2-*72 | 43.3 | 131 | 1701 | 0.13 |
| 2-*73 | 37.0 | 140 | 1620 | 0.16 |
| 2-74 | 51.0 | 102 | 1409 | 0.08 |
| 2-75 | 50.0 | 115 | 1380 | 0.04 |
| 2-76 | 46.8 | 143 | 1322 | 0.04 |
| 2-77 | 40.5 | 143 | 1320 | 0.03 |
| 2-*78 | 37.0 | 143 | 1300 | 0.02 |
| 2-*79 | 40.8 | 226 | 1008 | 0.00 |
| 2-80 | 48.1 | 123 | 1386 | 0.07 |
| 2-81 | 51.0 | 118 | 1390 | 0.05 |
| 2-82 | 49.0 | 105 | 1410 | 0.07 |
| 2-83 | 46.5 | 149 | 1439 | 0.06 |
| 2-84 | 48.9 | 116 | 1442 | 0.05 |
| 2-85 | 49.0 | 113 | 1460 | 0.08 |
| 2-86 | 49.5 | 108 | 1482 | 0.09 |
| 2-87 | 50.1 | 102 | 1496 | 0.10 |

Samples marked with * lie outside the scope of the invention.

In Tables 5 to 7, the samples Nos. 2-1 to 2-79 and 2-84 to 2-87 have used La as M in the composition formula, the sample No. 2-80 has used Nd as M, the sample No. 2-81 has used Pr as M, the sample No. 2-82 has used Sm as M, and the sample No. 2-83 has used Gd as M.

From Tables 8 to 10, the piezoelectric ceramic compositions of Example 2 of the present invention exhibit planar electromechanical coupling coefficients Kp of as large as 40% or greater, mechanical quality factor Qm of as small as 200 or less, dielectric constants of as small as 1500 or less, and changes $fr_a$ of smaller than 0.1% as measured by the heat resistance testing.

Example 3

Starting powders of PbO, $ZrO_2$, $TiO_2$, $Nb_2O_5$, $Cr_2O_3$, $Y_2O_3$, $Co_3O_4$, $SrCO_3$ and $Na_2CO_3$, as well as a starting powder of at least one oxide of La, Gd, Nd, Sm or Pr were weighed in predetermined amounts so as to obtain compositions as shown in Tables 11 and 12, and were wet-mixed for not shorter than 12 hours using a ball mill which contained $ZrO_2$ balls. The mixtures were then dehydrated, dried, calcined at 900° C. for 3 hours, and the calcined products were pulverized again using the ball mill.

The pulverized products were then mixed with an organic binder (PVA) and were granulated. powders were press-molded into disks measuring 23 mm in diameter and 2 mm in thickness under a pressure of 1.5 tons/cm². The molded products were introduced into a hermetically sealed container made of MgO or the like and were fired in the open air at 1250° C. for 2 hours.

The obtained sintered products were polished to form disks which were 0.5 mm thick. A silver paste was baked onto both surfaces of the disks at 600° C. to form electrodes. The disks were then polarized in a silicone oil maintained at 80° C. by applying a DC voltage of 3 kv/mm thereto for 30 minutes in order to evaluate their planar electromechanical coupling coefficients Kp, mechanical quality factor Qm and heat resistance. Their dielectric constants εr were also calculated from the capacitances found by using an impedance meter.

The planar electromechanical coupling coefficients Kp and the mechanical quality factor Qm were calculated from the resonant frequencies and anti-resonant frequencies measured by using an impedance meter (1 KHz, 1 Vrms). The heat resistance was evaluated in terms of a change $fr_a$ calculated in compliance with the equation $fr_a=|(fr2-fr1)|/fr1\times100$ based on a resonance frequency fr1 of before the testing in which the disks were passed through a solder reflow furnace of a peak temperature of 250° C. three times consecutively and a resonance frequency fr2 of after the testing. The results were as shown in Tables 13 and 14.

In Tables 11 and 12, the samples Nos. 3-1 to 3-34 and 3-39 to 3-67 have used La as M in the composition formula, the sample No. 3-35 has used Gd as M, the sample No. 3-36 has used Nd as M, the sample No. 3-37 has used Sm as M, and the sample No. 3-38 has used Pr as M.

From Tables 13 and 14, the piezoelectric ceramic compositions of Example 3 of the present invention exhibit planar electromechanical coupling coefficients Kp of as large as 40% or greater, mechanical quality factor Qm of as small as 200 or less, dielectric constants of as small as 1500 or less, and changes $fr_a$ of smaller than 0.1% as measured by the heat resistance testing.

TABLE 11

$(Pb_{1-x-\alpha-y}Sr_xNa_\alpha M_y)_a[(Nb_bY_cCr_dCo_e)_fTi_gZr_{1-f-g}]O_3$

| Sample No. | Sr x | Na$_\alpha$ | M y | a | b | c | d | e | f | g |
|---|---|---|---|---|---|---|---|---|---|---|
| 3-*1 | — | 0.003 | La 0.003 | 1.00 | 0.58 | 0.12 | 0.20 | 0.10 | 0.08 | 0.48 |
| 3-*2 | 0.001 | 0.001 | La 0.002 | 1.00 | 0.30 | 0.30 | 0.30 | 0.10 | 0.06 | 0.49 |
| 3-3 | 0.005 | 0.002 | La 0.005 | 1.00 | 0.58 | 0.12 | 0.20 | 0.10 | 0.06 | 0.48 |
| 3-4 | 0.010 | 0.003 | La 0.005 | 1.00 | 0.58 | 0.12 | 0.20 | 0.10 | 0.06 | 0.49 |
| 3-5 | 0.015 | 0.002 | La 0.004 | 1.00 | 0.61 | 0.10 | 0.22 | 0.07 | 0.05 | 0.49 |
| 3-6 | 0.015 | 0.002 | La 0.004 | 1.00 | 0.56 | 0.10 | 0.22 | 0.12 | 0.05 | 0.49 |
| 3-*7 | 0.015 | 0.001 | La 0.004 | 1.06 | 0.57 | 0.10 | 0.25 | 0.08 | 0.08 | 0.48 |
| 3-8 | 0.020 | 0.003 | La 0.005 | 1.00 | 0.58 | 0.12 | 0.20 | 0.10 | 0.08 | 0.49 |
| 3-*9 | 0.020 | 0.001 | La 0.001 | 1.00 | 0.50 | 0.20 | 0.30 | — | 0.06 | 0.49 |
| 3-*10 | 0.020 | 0.001 | La 0.003 | 1.00 | 0.60 | 0.10 | 0.20 | 0.10 | 0.01 | 0.49 |
| 3-*11 | 0.020 | 0.001 | La 0.003 | 0.94 | 0.65 | 0.15 | 0.18 | 0.02 | 0.05 | 0.49 |
| 3-12 | 0.020 | 0.001 | La 0.003 | 0.95 | 0.50 | 0.20 | 0.20 | 0.10 | 0.06 | 0.49 |
| 3-13 | 0.020 | 0.001 | La 0.003 | 0.98 | 0.51 | 0.15 | 0.30 | 0.04 | 0.07 | 0.49 |
| 3-14 | 0.020 | 0.001 | La 0.003 | 0.99 | 0.50 | 0.20 | 0.20 | 0.10 | 0.06 | 0.49 |
| 3-15 | 0.020 | 0.001 | La 0.003 | 1.00 | 0.50 | 0.20 | 0.20 | 0.10 | 0.06 | 0.49 |
| 3-16 | 0.020 | 0.001 | La 0.003 | 1.01 | 0.51 | 0.15 | 0.30 | 0.04 | 0.07 | 0.49 |
| 3-17 | 0.020 | 0.001 | La 0.003 | 1.03 | 0.50 | 0.20 | 0.20 | 0.10 | 0.08 | 0.48 |
| 3-*18 | 0.020 | 0.001 | La 0.003 | 1.05 | 0.50 | 0.20 | 0.20 | 0.10 | 0.16 | 0.53 |
| 3-*19 | 0.020 | 0.001 | La 0.004 | 1.00 | 0.50 | 0.20 | 0.20 | 0.10 | 0.06 | 0.49 |
| 3-*20 | 0.020 | 0.001 | La 0.004 | 1.00 | 0.51 | 0.15 | 0.30 | 0.04 | 0.07 | 0.45 |
| 3-21 | 0.020 | 0.001 | La 0.004 | 1.00 | 0.51 | 0.15 | 0.30 | 0.04 | 0.07 | 0.48 |
| 3-22 | 0.020 | 0.001 | La 0.004 | 1.00 | 0.47 | 0.15 | 0.30 | 0.08 | 0.06 | 0.48 |
| 3-23 | 0.020 | 0.001 | La 0.004 | 1.00 | 0.47 | 0.15 | 0.28 | 0.10 | 0.06 | 0.48 |
| 3-24 | 0.020 | 0.001 | La 0.004 | 1.00 | 0.65 | 0.10 | 0.15 | 0.10 | 0.06 | 0.48 |
| 3-25 | 0.020 | 0.001 | La 0.004 | 1.00 | 0.51 | 0.15 | 0.30 | 0.04 | 0.07 | 0.50 |
| 3-26 | 0.020 | 0.001 | La 0.004 | 1.00 | 0.51 | 0.15 | 0.30 | 0.04 | 0.07 | 0.52 |
| 3-27 | 0.020 | 0.001 | La 0.004 | 1.00 | 0.51 | 0.15 | 0.30 | 0.04 | 0.07 | 0.46 |
| 3-28 | 0.020 | 0.001 | La 0.004 | 1.00 | 0.51 | 0.15 | 0.30 | 0.04 | 0.07 | 0.51 |
| 3-29 | 0.020 | 0.001 | La 0.004 | 1.00 | 0.51 | 0.15 | 0.30 | 0.04 | 0.02 | 0.49 |
| 3-30 | 0.020 | 0.001 | La 0.004 | 1.00 | 0.51 | 0.15 | 0.30 | 0.04 | 0.12 | 0.49 |
| 3-31 | 0.020 | 0.001 | La 0.004 | 1.00 | 0.51 | 0.15 | 0.30 | 0.04 | 0.15 | 0.49 |
| 3-32 | 0.020 | 0.001 | La 0.004 | 1.00 | 0.51 | 0.15 | 0.33 | 0.01 | 0.07 | 0.49 |
| 3-33 | 0.020 | 0.001 | La 0.004 | 1.00 | 0.51 | 0.07 | 0.33 | 0.09 | 0.07 | 0.49 |
| 3-34 | 0.020 | 0.001 | La 0.004 | 1.00 | 0.51 | 0.02 | 0.35 | 0.12 | 0.07 | 0.49 |

Samples marked with * lie outside the scope of the invention.

TABLE 12

$(Pb_{1-x-\alpha-y}Sr_xNa_\alpha M_y)_a[(Nb_bY_cCr_dCo_e)_fTi_gZr_{1-f-g}]O_3$

| Sample No. | Sr x | Na$_\alpha$ | M y | a | b | c | d | e | f | g |
|---|---|---|---|---|---|---|---|---|---|---|
| 3-35 | 0.020 | 0.001 | Gd 0.004 | 1.00 | 0.51 | 0.15 | 0.30 | 0.04 | 0.07 | 0.49 |
| 3-36 | 0.020 | 0.001 | Nd 0.004 | 1.00 | 0.51 | 0.15 | 0.30 | 0.04 | 0.07 | 0.49 |
| 3-37 | 0.020 | 0.001 | Sm 0.004 | 1.00 | 0.51 | 0.15 | 0.30 | 0.04 | 0.07 | 0.49 |
| 3-38 | 0.020 | 0.001 | Pr 0.004 | 1.00 | 0.51 | 0.15 | 0.30 | 0.04 | 0.07 | 0.49 |
| 3-*39 | 0.020 | 0.001 | La 0.004 | 1.00 | 0.51 | 0.15 | 0.30 | 0.04 | 0.07 | 0.53 |
| 3-*40 | 0.020 | 0.001 | La 0.004 | 1.00 | 0.20 | 0.40 | 0.20 | 0.20 | 0.07 | 0.48 |
| 3-41 | 0.020 | 0.001 | La 0.005 | 1.00 | 0.58 | 0.12 | 0.20 | 0.10 | 0.06 | 0.48 |
| 3-42 | 0.020 | 0.001 | La 0.005 | 1.00 | 0.58 | 0.12 | 0.20 | 0.10 | 0.10 | 0.48 |
| 3-43 | 0.020 | 0.001 | La 0.005 | 1.00 | 0.58 | 0.12 | 0.21 | 0.09 | 0.10 | 0.48 |
| 3-44 | 0.020 | 0.001 | La 0.005 | 1.00 | 0.58 | 0.12 | 0.26 | 0.04 | 0.10 | 0.48 |
| 3-45 | 0.020 | 0.001 | La 0.005 | 1.00 | 0.50 | 0.12 | 0.35 | 0.03 | 0.10 | 0.48 |
| 3-46 | 0.020 | 0.001 | La 0.005 | 1.00 | 0.50 | 0.07 | 0.40 | 0.03 | 0.10 | 0.48 |
| 3-47 | 0.020 | 0.001 | La 0.005 | 1.00 | 0.50 | 0.05 | 0.42 | 0.03 | 0.10 | 0.48 |
| 3-*48 | 0.020 | 0.001 | La 0.005 | 1.00 | 0.58 | 0.12 | 0.20 | 0.10 | 0.20 | 0.48 |
| 3-49 | 0.020 | 0.001 | La 0.020 | 1.00 | 0.52 | 0.15 | 0.25 | 0.08 | 0.07 | 0.48 |

TABLE 12-continued $(Pb_{1-x-\alpha-y}Sr_xNa_\alpha M_y)_a[(Nb_bY_cCr_dCo_e)_fTi_gZr_{1-f-g}]O_3$

| Sample No. | Sr x | Na α | M y | a | b | c | d | e | f | g |
|---|---|---|---|---|---|---|---|---|---|---|
| 3-50 | 0.020 | 0.001 | La 0.030 | 1.00 | 0.52 | 0.15 | 0.25 | 0.08 | 0.07 | 0.49 |
| 3-51 | 0.020 | 0.001 | La 0.040 | 1.00 | 0.52 | 0.15 | 0.25 | 0.08 | 0.07 | 0.49 |
| 3-52 | 0.020 | 0.001 | La 0.050 | 1.00 | 0.52 | 0.15 | 0.25 | 0.08 | 0.07 | 0.49 |
| 3-53 | 0.020 | 0.002 | La 0.005 | 1.00 | 0.58 | 0.12 | 0.20 | 0.10 | 0.07 | 0.49 |
| 3-54 | 0.020 | 0.002 | La 0.005 | 1.00 | 0.58 | 0.12 | 0.20 | 0.10 | 0.06 | 0.48 |
| 3-55 | 0.020 | 0.003 | La 0.005 | 1.00 | 0.58 | 0.12 | 0.20 | 0.10 | 0.06 | 0.48 |
| 3-56 | 0.020 | 0.004 | La 0.005 | 1.00 | 0.58 | 0.12 | 0.20 | 0.10 | 0.06 | 0.48 |
| 3-57 | 0.020 | 0.005 | La 0.005 | 1.00 | 0.58 | 0.12 | 0.20 | 0.10 | 0.06 | 0.48 |
| 3-*58 | 0.020 | 0.002 | La 0.004 | 1.00 | 0.50 | 0.01 | 0.39 | 0.10 | 0.05 | 0.49 |
| 3-*59 | 0.020 | 0.006 | La 0.005 | 1.00 | 0.58 | 0.12 | 0.20 | 0.10 | 0.10 | 0.48 |
| 3-60 | 0.030 | 0.001 | La 0.010 | 1.00 | 0.60 | 0.10 | 0.20 | 0.10 | 0.05 | 0.49 |
| 3-*61 | 0.050 | 0.001 | La 0.070 | 1.00 | 0.75 | 0.10 | 0.10 | 0.05 | 0.06 | 0.49 |
| 3-62 | 0.050 | 0.001 | La 0.005 | 1.00 | 0.60 | 0.15 | 0.15 | 0.10 | 0.06 | 0.49 |
| 3-63 | 0.050 | 0.001 | La 0.005 | 1.00 | 0.51 | 0.17 | 0.30 | 0.02 | 0.06 | 0.49 |
| 3-*64 | 0.060 | 0.002 | La 0.004 | 1.00 | 0.25 | 0.15 | 0.50 | 0.10 | 0.05 | 0.49 |
| 3-65 | 0.080 | 0.002 | La 0.005 | 1.00 | 0.58 | 0.12 | 0.20 | 0.10 | 0.06 | 0.49 |
| 3-*66 | 0.090 | 0.002 | La 0.005 | 1.00 | 0.58 | 0.12 | 0.20 | 0.10 | 0.06 | 0.48 |
| 3-67 | 0.020 | 0.001 | La 0.005 | 1.00 | 0.70 | 0.10 | 0.15 | 0.05 | 0.06 | 0.48 |

Samples marked with * lie outside the scope of the invention.

TABLE 13

| Sample No. | Kp (%) | Qm | εr | Fr_a (%) |
|---|---|---|---|---|
| 3-*1 | 38.5 | 170 | 1083 | 0.16 |
| 3-*2 | 38.0 | 205 | 1190 | 0.42 |
| 3-3 | 41.0 | 153 | 1130 | 0.08 |
| 3-4 | 43.0 | 142 | 1100 | 0.09 |
| 3-5 | 48.2 | 155 | 1100 | 0.02 |
| 3-6 | 49.0 | 142 | 1120 | 0.03 |
| 3-*7 | 34.0 | 190 | 1170 | 0.47 |
| 3-8 | 44.0 | 140 | 1180 | 0.08 |
| 3-*9 | 39.0 | 210 | 1120 | 0.21 |
| 3-*10 | 28.0 | 240 | 1100 | 0.57 |
| 3-*11 | 29.0 | 210 | 1150 | 0.35 |
| 3-12 | 36.0 | 180 | 1180 | 0.09 |
| 3-13 | 44.0 | 137 | 1300 | 0.04 |
| 3-14 | 47.0 | 140 | 1280 | 0.06 |
| 3-15 | 45.0 | 143 | 1140 | 0.07 |
| 3-16 | 50.0 | 129 | 1310 | 0.03 |
| 3-17 | 47.0 | 128 | 1280 | 0.04 |
| 3-*18 | 32.0 | 140 | 1010 | 0.15 |
| 3-19 | 47.0 | 123 | 1310 | 0.09 |
| 3-*20 | 30.0 | 100 | 980 | 0.64 |
| 3-21 | 49.0 | 135 | 1320 | 0.03 |
| 3-22 | 48.5 | 130 | 1300 | 0.04 |
| 3-23 | 49.0 | 138 | 1310 | 0.05 |
| 3-24 | 50.0 | 132 | 1300 | 0.06 |
| 3-25 | 47.0 | 140 | 1270 | 0.05 |
| 3-26 | 43.0 | 152 | 1210 | 0.08 |
| 3-27 | 48.0 | 137 | 1280 | 0.09 |
| 3-28 | 45.0 | 146 | 1230 | 0.07 |
| 3-29 | 40.5 | 150 | 1200 | 0.06 |
| 3-30 | 46.5 | 132 | 1280 | 0.08 |
| 3-31 | 47.0 | 136 | 1300 | 0.07 |
| 3-32 | 48.0 | 125 | 1340 | 0.04 |
| 3-33 | 47.4 | 134 | 1320 | 0.05 |
| 3-34 | 45.5 | 138 | 1280 | 0.09 |

Samples marked with * lie outside the scope of the invention.

TABLE 14

| Sample No. | Kp (%) | Qm | εr | Fr_a (%) |
|---|---|---|---|---|
| 3-35 | 45.3 | 140 | 1310 | 0.02 |
| 3-36 | 46.5 | 134 | 1330 | 0.04 |
| 3-37 | 47.5 | 132 | 1360 | 0.06 |
| 3-38 | 47.0 | 130 | 1350 | 0.04 |
| 3-*39 | 31.0 | 175 | 1200 | 0.15 |
| 3-*40 | 33.0 | 270 | 1070 | 0.14 |
| 3-41 | 46.0 | 142 | 1200 | 0.06 |
| 3-42 | 48.0 | 135 | 1370 | 0.08 |
| 3-43 | 43.5 | 130 | 1180 | 0.05 |
| 3-44 | 43.0 | 135 | 1150 | 0.04 |
| 3-45 | 42.5 | 142 | 1120 | 0.04 |
| 3-46 | 42.5 | 144 | 1120 | 0.04 |
| 3-47 | 42.0 | 145 | 1100 | 0.03 |
| 3-*48 | 51.0 | 140 | 1620 | 0.44 |
| 3-49 | 49.5 | 134 | 1350 | 0.03 |
| 3-50 | 50.0 | 130 | 1370 | 0.07 |
| 3-51 | 51.5 | 122 | 1390 | 0.09 |
| 3-52 | 52.0 | 121 | 1450 | 0.10 |
| 3-53 | 47.0 | 141 | 1320 | 0.05 |
| 3-54 | 46.0 | 138 | 1270 | 0.03 |
| 3-55 | 45.0 | 152 | 1290 | 0.06 |
| 3-56 | 45.0 | 162 | 1210 | 0.05 |
| 3-57 | 41.0 | 170 | 1180 | 0.02 |
| 3-58 | 40.0 | 172 | 1400 | 0.46 |
| 3-59 | 36.0 | 320 | 1020 | 0.92 |
| 3-60 | 47.0 | 150 | 1380 | 0.05 |
| 3-*61 | 53.0 | 120 | 1730 | 0.64 |
| 3-62 | 50.0 | 144 | 1350 | 0.03 |
| 3-63 | 47.0 | 162 | 1320 | 0.05 |
| 3-*64 | 42.0 | 193 | 1530 | 0.21 |
| 3-65 | 48.3 | 153 | 1490 | 0.09 |
| 3-*66 | 50.0 | 130 | 1610 | 0.34 |
| 3-67 | 50.0 | 128 | 1480 | 0.09 |

Samples marked with * lie outside the scope of the invention.

We claim:

1. A piezoelectric ceramic composition comprising a perovskite compound which contains, as metal components, Pb, Sr, Zr, Ti, Nb, Cr, Y, Co and at least one element selected from La, Gd, Nd, Sm and Pr, and may further contain Sb or Na, and wherein the composition is expressed in accordance with the following formula:

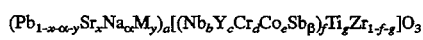

$(Pb_{1-x-\alpha-y}Sr_xNa_\alpha M_y)_a[(Nb_bY_cCr_dCo_eSb_\beta)_fTi_gZr_{1-f-g}]O_3$ wherein M is at least one element selected from La, Gd, Nd, Sm and Pr, and x, y, a, b, c, d, e, f, g, α and β satisfy the following relationships:

$0.005 \leq x \leq 0.08$, $0.002 \leq y \leq 0.05$,
$0.95 \leq a \leq 1.05$,
$0.47 \leq b \leq 0.70$
$0.02 \leq c \leq 0.31$
$0.11 \leq d \leq 0.42$,
$0.01 \leq e \leq 0.12$,
$0.02 \leq f \leq 0.15$,
$0.46 \leq g \leq 0.52$,
$0 \leq \alpha \leq 0.005$,
$0 \leq \beta \leq 0.13$, and
$b+c+d+e+\beta = 1.00$.

2. The piezoelectric ceramic composition of claim 1, wherein $\alpha=0$, $\beta=0$, and x, b and e lie within the following ranges:

$0.01 \leq x \leq 0.08$,
$0.52 \leq b \leq 0.62$, and
$0.02 \leq e \leq 0.12$.

3. The piezoelectric ceramic composition of claim 2, wherein x, y, a, b, c, d, e, f and g lie within the following ranges:

$0.01 \leq x \leq 0.015$,
$0.003 \leq y \leq 0.005$,
$0.99 \leq a \leq 1.01$,
$0.56 \leq b \leq 0.61$,
$0.02 \leq c \leq 0.17$,
$0.22 \leq d \leq 0.26$,
$0.02 \leq e \leq 0.09$,
$0.05 \leq f \leq 0.07$, and
$0.48 \leq g \leq 0.51$.

4. The piezoelectric ceramic composition of claim 1, wherein $\alpha=0$, $\beta$ lies within a range of $0.01 \leq \beta \leq 0.13$, and b lies within a range of $0.47 \leq b \leq 0.58$.

5. The piezoelectric ceramic composition of claim 4, wherein x, y, a, b, c, d, e, f, g and $\beta$ lie within the following ranges:

$0.01 \leq x \leq 0.03$,
$0.003 \leq y \leq 0.02$,
$0.99 \leq a \leq 1.01$,
$0.49 \leq b \leq 0.54$,
$0.09 \leq c \leq 0.17$,
$0.20 \leq d \leq 0.26$,
$0.02 \leq e \leq 0.09$,
$0.05 \leq f \leq 0.07$,
$0.48 \leq g \leq 0.51$, and
$0.04 \leq p \leq 0.10$.

6. The piezoelectric ceramic composition of claim 1, wherein $\alpha$ lies within a range of $0.001 \leq \alpha \leq 0.005$, $\beta=0$, and b lies within a range of $0.47 \leq b \leq 0.70$.

7. The piezoelectric ceramic composition of claim 6, wherein x, y, a, b, c, d, e, f, g and $\alpha$ lie within the following ranges:

$0.01 \leq x \leq 0.03$,
$0.003 \leq y \leq 0.02$,
$0.99 \leq a \leq 1.01$,
$0.49 \leq b \leq 0.65$,
$0.09 \leq c \leq 0.17$,
$0.20 \leq d \leq 0.26$,
$0.02 \leq e \leq 0.09$,
$0.05 \leq f \leq 0.07$,
$0.48 \leq g \leq 0.51$, and
$0.001 \leq \alpha \leq 0.004$.

8. The piezoelectric ceramic composition of any one of claims 1 to 7, wherein the metal component M in the composition formula is La.

* * * * *